United States Patent [19]

Redwine

[11] Patent Number: 4,926,224
[45] Date of Patent: May 15, 1990

[54] CROSSPOINT DYNAMIC RAM CELL FOR FOLDED BITLINE ARRAY

[75] Inventor: Donald J. Redwine, Houston, Tex.
[73] Assignee: Texas Instruments Incorporated, Dallas, Tex.
[21] Appl. No.: 319,923
[22] Filed: Mar. 6, 1989

Related U.S. Application Data

[63] Continuation of Ser. No. 201,812, Jun. 3, 1988, abandoned.
[51] Int. Cl.$^5$ .................... H01L 29/78; H01L 27/02; H01L 29/06
[52] U.S. Cl. .................................. 357/23.6; 357/41; 357/55
[58] Field of Search ........................ 357/23.6, 41, 55

[56] References Cited

U.S. PATENT DOCUMENTS 4,737,829  4/1988  Morimoto et al. .................. 365/149
4,769,786  9/1988  Garnache et al. .................. 357/23.1

FOREIGN PATENT DOCUMENTS 198590  10/1986  European Pat. Off. ........... 357/23.6
152056  8/1985  Japan ................................. 357/23.6

Primary Examiner—Rolf Hille
Assistant Examiner—Robert P. Limanek
Attorney, Agent, or Firm—Ferdinand M. Romano; Thomas W. DeMond; Melvin Sharp

[57] ABSTRACT

A dynamic random access memory cell array is disclosed which has storage capacitors and access transistors formed on the sidewalls of pillars created by trenches etched into the face of a semiconductor bar. A storage capacitor for a cell uses the sidewalls of the pillar as one plate and a polysilicon plug or web as the other plate. The channel of each access transistor is formed in the upper part of the sidewall of only a portion of the pillar, using an upper edge of the capacitor region as the source region of the transistor and having an N+ drain region at the top of the pillar. A crosspoint array is made possible by merging two adjacent wordlines as a pair of overlying conductor strips extending along the face over the trenches, between pillars, and forming the transistor gates by alternate protrusions from these strips, extending down into the trenches at the channel area.

28 Claims, 5 Drawing Sheets

CROSSPOINT DYNAMIC RAM CELL FOR FOLDED BITLINE ARRAY

This application is a continuation, of application Ser. No. 201,812, filed June 3, 1988 now abandoned.

BACKGROUND OF THE INVENTION

This invention relates to semiconductor devices and methods of making such devices, and more particularly to a dynamic random access memory cell and a process for manufacturing the cell.

Dynamic RAM devices are constructed in a so-called "folded bit line" arrangement to provide common mode noise rejection; folded bit line layouts are shown in U.S. Pat. No. 4,636,987, issued to Norwood et al., for example, and a modified version of a folded bit line is illustrated in U.S. Pat. Nos. 4,656,377 and 4,701,885; these patents are assigned to Texas Instruments. In the standard folded bit line layout, a true cross-point array is not possible in that every intersection of a word line and a bit line cannot have a cell; only half of these intersections can be populated with cells.

It is the principal object of this invention to provide an improved dynamic memory cell array of the type using a folded bit line layout, particularly a cell array allowing a true cross-point configuration. It is another object to provide a dynamic memory cell which is more easily constructed as a cross-point array so that the space occupied on the face of the bar is minimized. Another object is to provide a memory device of smaller size and optimum layout, and a method for making such a device.

SUMMARY OF THE INVENTION

In accordance with one embodiment of the invention a dynamic random access memory cell array has storage capacitors and access transistors formed at a face of a semiconductor bar, such as on the sidewalls of pillars created by trenches etched into the face of a semiconductor bar; in this example a storage capacitor for a cell uses the sidewalls of the pillar as one plate and a polysilicon plug or web as the other plate. The channel of each access transistor is formed in the upper part of the sidewall of only a portion of the pillar, using an upper edge of the capacitor region as the source region of the transistor and having an N+ drain region on the face. According to the invention, a cross-point array is made possible by merging two adjacent wordlines as a pair of overlying conductor strips extending along the face, between pillars in this case, and forming the transistor gates by alternate protrusions from these strips, extending down into the trenches at the channel area.

BRIEF DESCRIPTION OF THE DRAWINGS

The novel features believed characteristic of the invention are set forth in the appended claims. The invention itself, however, as well as further objects and advantages thereof, will best be understood by reference to the following detailed description of particular embodiments, when read in conjunction with the accompanying drawings, wherein:

DETAILED DESCRIPTION OF SPECIFIC EMBODIMENTS

Figure 1:
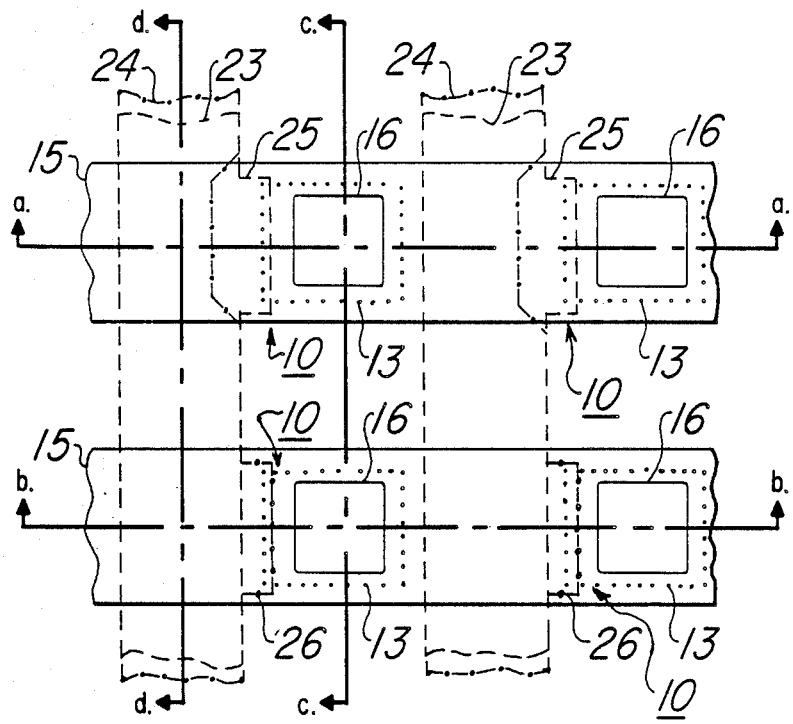
FIG. 1 is a plan view of a dynamic memory cell according to one embodiment of the invention.
Figure 2:
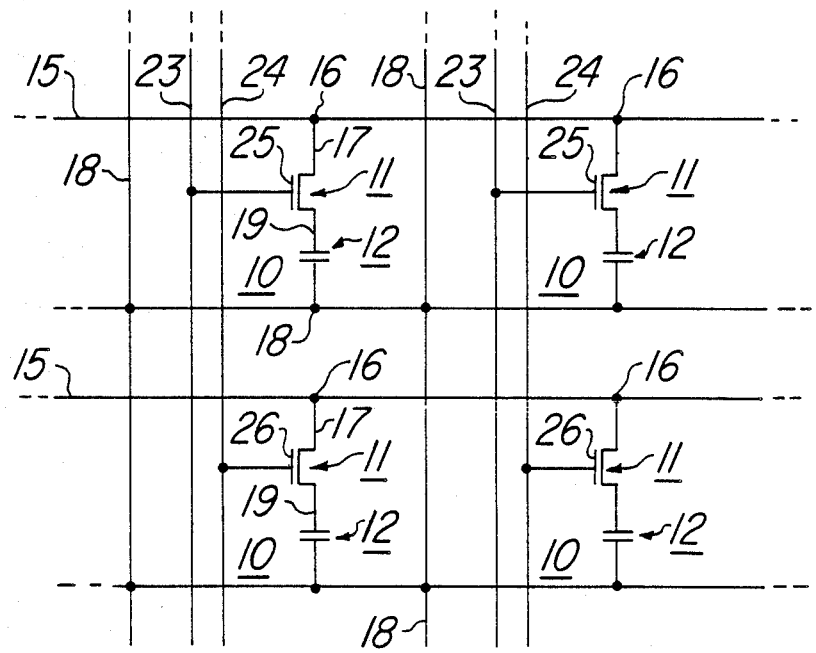
FIG. 2 is an electrical schematic diagram of the cell array of FIG. 1.
Figure 2A:
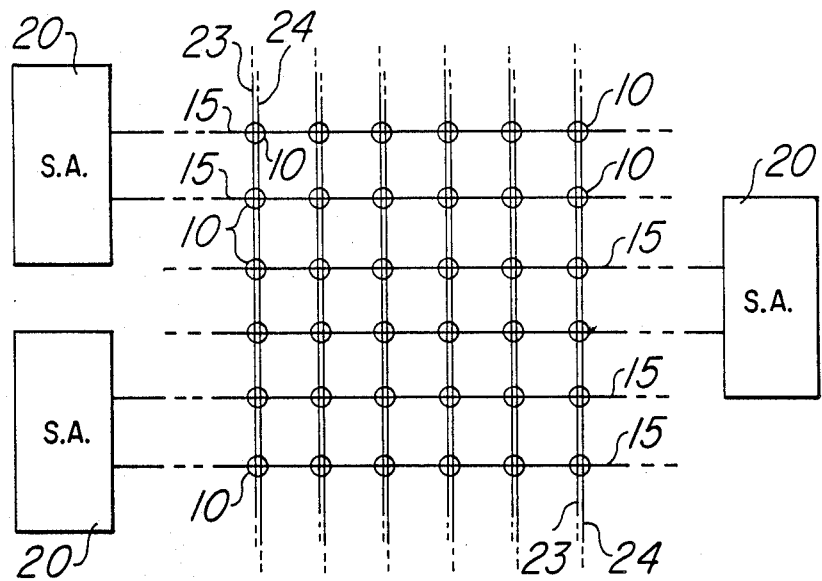
FIG. 2a is an electrical schematic diagram like FIG. 2 but including a larger part of the cell array.

FIG. 1 is a plan view of a very small part of a dynamic RAM cell array constructed according to an embodiment of the invention, and FIGS. 2 and 2a and FIGS. 3a–3d illustrate an electrical schematic diagram and sectional views of the cells of FIG. 1. The view of FIG. 1 contains four one-transistor cells 10, each cell having an access transistor 11 and a capacitor 12, with each of these cells being formed on and surrounding a pillar 13 which is created in the face of a silicon bar 14. A metal bit line 15 extends across the tops of a column of cells, making a metal-to-silicon contact 16 to the drain region 17 of each access transistor 11. The capacitor 12 of each cell includes a polysilicon grid or web 18 extending throughout the cell array to provide a common plate which would be connected to a voltage such as Vdd at a position along the face of the chip spaced from the cells; that is, the polysilicon web 18 may be thought of as a plate filling the lower part of the space between pillars 13, with holes for the pillars to extend through. The other plate of each capacitor 12 is a semiconductor region 19 surrounding the pillar 13 for each cell, this semiconductor region in this case being inverted due to the voltage on the plate 18, although in another embodiment the plate 18 could be grounded and the region 19 formed by an N implant or diffusion. The capacitor regions 19 on the pillars 13 are isolated from one another by a field oxide layer 21 in the bottom of the trenches between the pillars, with a P+ channel-stop region 22 beneath the field oxide. Each pair of adjacent bitlines 15 of the array of cells 10 of FIGS. 1–3 is connected to a sense amplifier 20 as seen in FIG. 2a; these sense amplifiers may be of the type disclosed in the aforementioned U.S. Pat. Nos. 4,636,987, 4,656,377, or 4,701,885.

According to the invention, the wordlines in the cell array of FIGS. 1–3 are made up of overlapping polysilicon strips 23 and 24 extending along the face perpendicular to the bitlines 15; at alternating pillars, each of these strips 23 or 24 has a transistor gate 25 or 26 extending from the side of the strip and down into a recess adjacent to a sidewall 27 of a pillar, where this sidewall 27 in each case forms the channel of a transistor 11. The source of each access transistor 11 is created by the upper edge 28 of the semiconductor region 19 of a capacitor 12. Gate oxide 29 separates the gates 25 or 26 from the channels 27. The upper part of the space between pillars 13, above the polysilicon 18, is filled with oxide 30, and of course interlevel oxide 31 and 32 separates the first and second level polysilicon 23 and 24 and the metal bitline 15.

Figure 2B:
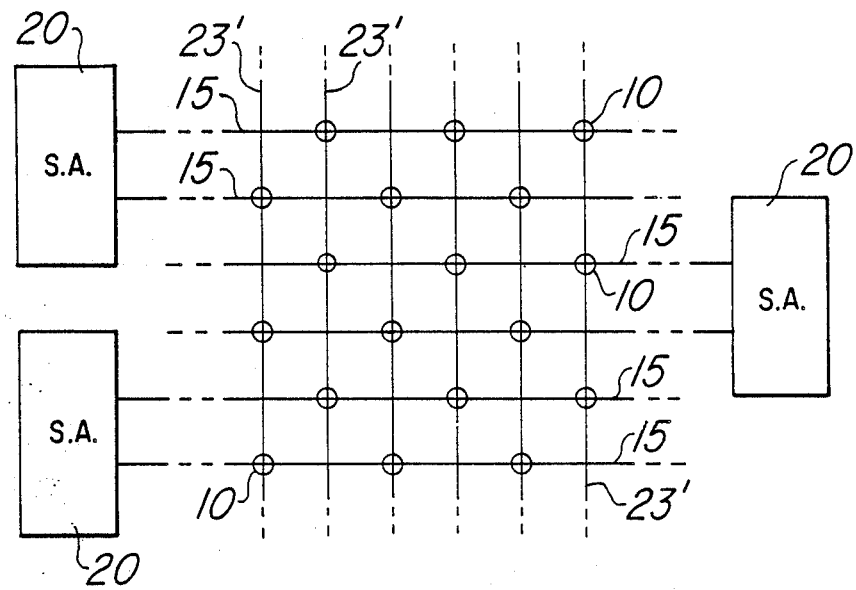
FIG. 2b is an electrical schematic diagram like FIG. 2a but illustrating a prior art cell array.
Figure 3A:
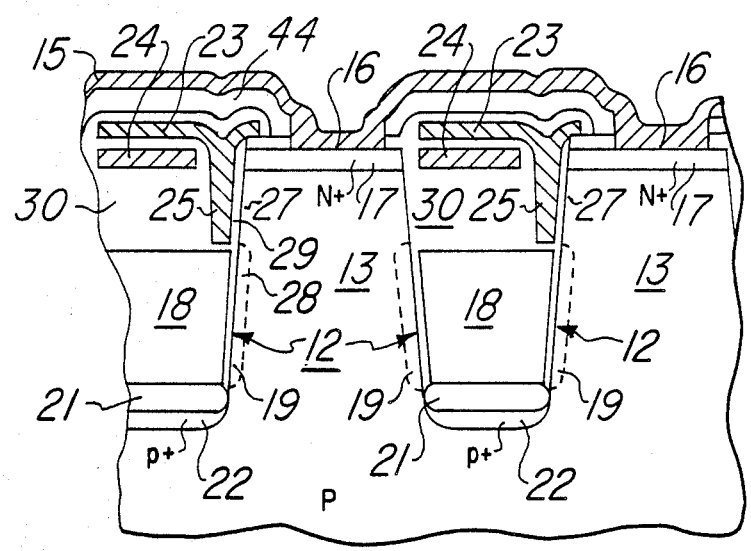
FIGS. 3a–3d are elevation views in section of the cell of FIGS. 1 and 2, taken along the lines a—a, b—b, c—c and d—d of FIG. 1.
Figure 3B:
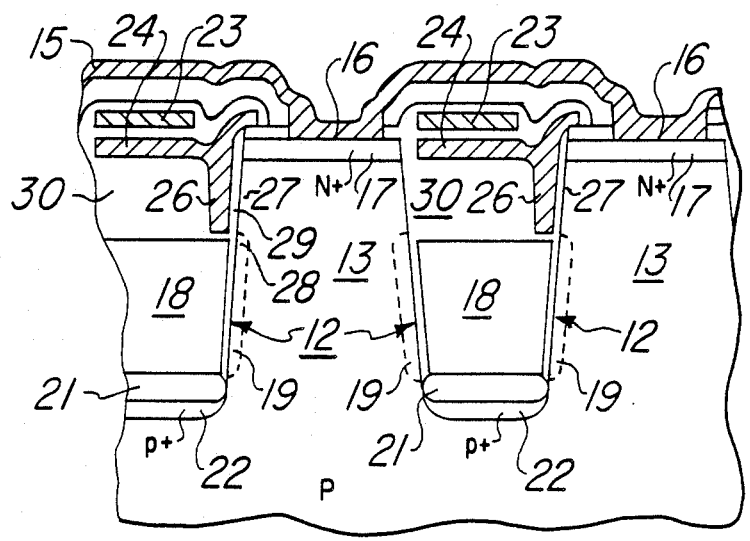
Figure 3C:
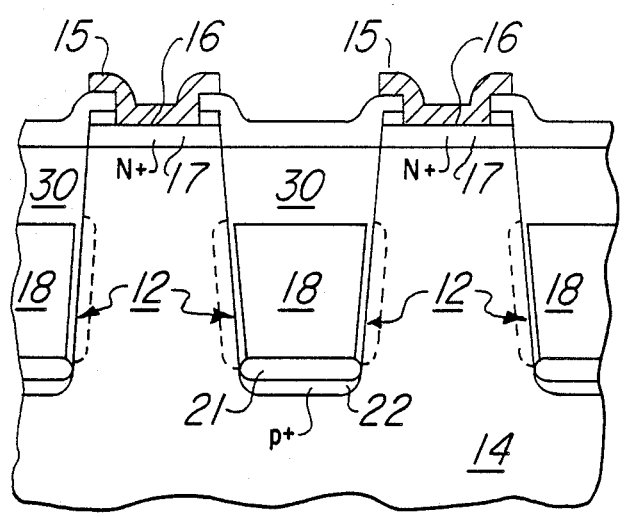
Figure 3D:
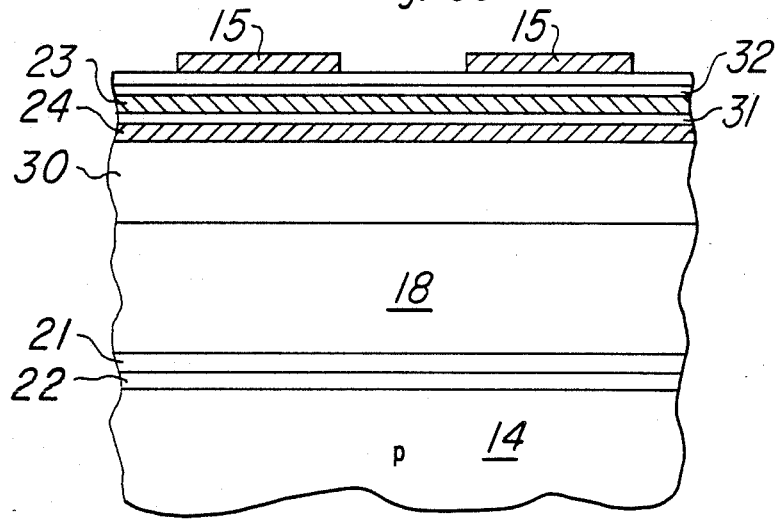

Referring to FIG. 2a, the advantage of the feature of stacking the two adjacent wordlines 23 and 24 on top of one another is that a true cross-point array is possible using folded bit lines layouts. Each pair of bitlines 15 is connected at one end of the array to a sense amplifier 20, it being shown in this embodiment that the sense amplifiers are staggered, i.e. alternating from one side of the array to the other, but if the sense amplifiers are laid out to be narrower then all sense amplifiers can be on one side. Note that there is a cell 10 at every cross-point of a wordline (lines 23 and 24 considered together), and a bitline 15. This permits a more dense array, compared to the usual layout as seen in FIG. 2b, which requires half of the intersections of bitlines 15 and wordlines 23' to be unpopulated with cells 10 if a true folded bit line configuration is used. Crosspoint arrays have been constructed using cells as disclosed by Richardson, et al., in Proceedings of the International Electronic Devices Meeting, IEEE, 1985, pp. 714–717, but a quasi-folded bit line configuration was necessary as set forth in the above-mentioned patents.

Figure 4A:
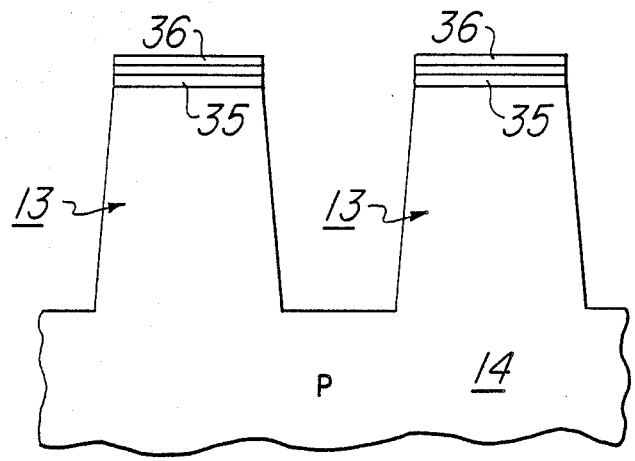
FIGS. 4a–4c are section views like FIG. 3a, at various stages of manufacture of the cell of FIGS. 1–3.
Figure 4B:
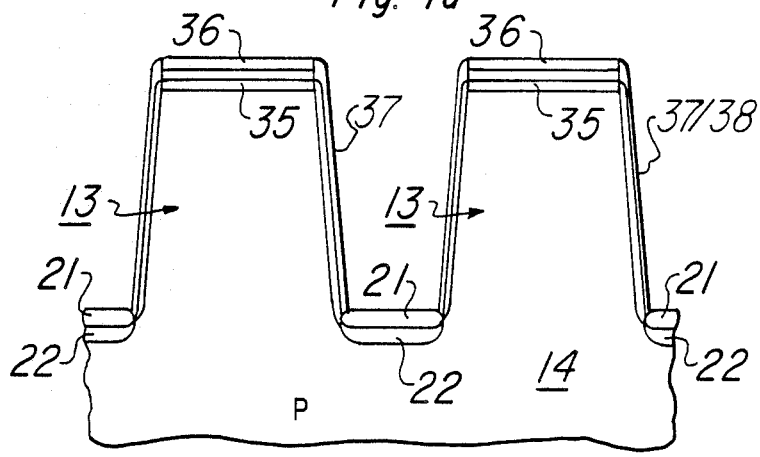
Figure 4C:
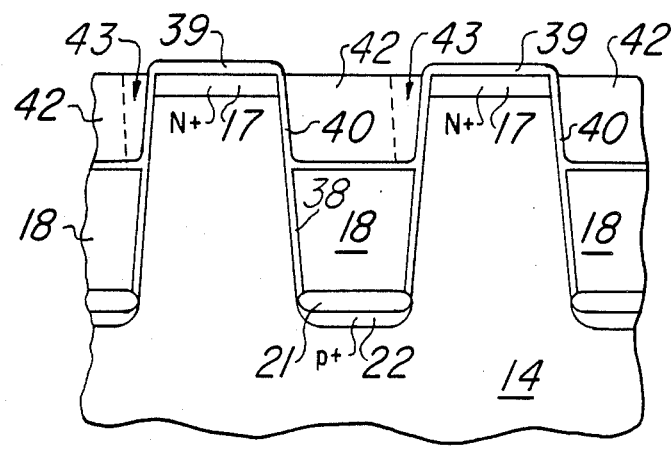

A method of making the cell of FIGS. 1–3 will be described with reference to FIGS. 4a–4c. The starting material is a slice of P-type, semiconductor-grade, single-crystal silicon of which the portion of the bar 14 seen in the Figures is only a very minute part; the cells of FIG. 1 are of course only four of 4-Meg or 16-Meg on a bar, and perhaps several hundred bars would be formed on a slice at one time. Only the steps used to create the cell array will be described, it being understood that the periphery of the device would be made using CMOS processing as is usual at the present time, or in addition bipolar devices may be included as well. First, a coating of silicon oxide is thermally grown by exposing the slice to steam at an elevated temperature, and an arsenic implant is performed, as seen in FIG. 4a, to create an N+ layer 35 which will become the buried N+ drain regions 17; this implant will be masked as needed in the periphery. Then, a silicon nitride layer 36 is added over the oxide, the oxide and nitride layers are patterned using photoresist to leave uncovered the areas where the trenches are to be etched to leave the pillars. These trenches are next etched to a depth of perhaps 6 to 8 microns, using reactive ion etching, to leave the upstanding pillars 13 as seen in FIG. 4a. To create the field oxide layers 21, a thin thermal oxide coating is grown on the sidewalls, then a thin nitride coating 37 is deposited to cover the sidewalls of the pillars over this oxide, and an anisotropic etch is used to remove this thin nitride from the bottom flat surfaces between the pillars. A boron implant done at this point creates what will become the P+ channel-stop regions 22. Following the boron implant, an oxidation creates the field oxide 21. The nitride 37 is removed by etching, the sidewalls are cleaned, and the capacitor dielectric 38 is created as seen in FIG. 4c by thermal oxide growth or oxide plus nitride. A doped polysilicon deposition is performed next to fill the spaces between the pillars 13, and an anisotropic etch is done to remove this doped polysilicon down to a level of about two-thirds the pillar height, leaving the plugs or web 18. Next the original nitride 36 is stripped off, and any remaining oxide on the exposed sidewalls or tops of the pillars, and a thermal oxidation produces thick oxide 39 over the heavily-doped N+drains 17 and thin oxide 40 on the sidewalls, as well as oxide on top of the web 18; a silicon nitride coating may be added over this oxide to function as an etch-stop. The upper parts of the areas between pillars (above web 18) is now filled with deposited oxide 42, and the deposited oxide is etched back to the level of the pillar tops. Using a photoresist mask which exposes holes over where alternate gates 25 or 26 are to be, an anisotropic etch is performed to create recesses 43 where half of the gates are to be created. Referring back to FIGS. 1 and 3a–3d, a first level of polycrystalline silicon is next deposited, then patterned to leave the strips 24 and gates 26. The first-level polysilicon is oxidized to create the interlevel oxide 31, and then a second set of recesses (like the recesses 43) are etched using another photoresist masking operation, to allow the gates 25 for the other half of the cells to be created by second-level polysilicon; to this end, a layer of polycrystalline silicon is deposited over the oxide 31 and extending into the second set of recesses, then patterned using photoresist. The second-level polysilicon is oxidized to create the layer 32, then a thick oxide 44 is deposited, and another photoresist masking operation is used to open the holes for the contacts 16, followed by a metal deposition and patterning to leave the bitlines 15.

Although a pillar type cell has been disclosed, the concept of the invention can be used in various other cells, such as a trench type cell as disclosed in the aforementioned Richardson et al. article, or various other cells of this type.

While this invention has been described with reference to illustrative embodiments, this description is not meant to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A dynamic random access memory cell formed on a semiconductor body having an upper surface and a trench region formed therein, the trench region including a trench upper portion extending toward the upper surface and a trench lower portion extending away from the upper surface into the semiconductor body, said cell comprising:
   a transistor including a first source/drain region formed on the upper semiconductor surface and a channel region formed in the semiconductor body along the trench upper portion;
   a first capacitor region formed in the trench lower portion;
   a second capacitor region formed in the semiconductor body adjacent the first capacitor region and extending toward the transistor channel region;
   an insulative layer position between said first and second capacitor regions to provide electrical isolation between said regions; and
   a pair of overlapping conductive layers electrically isolated from one another each layer extending along the upper surface of the semiconductor body adjacent the first source/drain region, one of said layers including a segment protruding into the trench upper portion along the channel region forming a control gate for the transistor.

2. The cell of claim 1 wherein the first capacitor region comprises polysilicon material.

3. The cell of claim 1 wherein the second capacitor region undergoes inversion when a voltage is applied to the first capacitor region.

4. The cell of claim 1 further including a bit line extending over said conductive layers and over the first source drain region.

5. The cell according to claim 1 wherein the trench region defines a semiconductor pillar on which the first source/drain region, the channel region and the second capacitor region are formed.

6. The cell according to claim 5 wherein:

the trench region defines a plurality of additional semiconductor pillars arranged in rows and columns along the upper surface of the semiconductor body, the first capacitor region extending about the plurality of pillar thereby forming a conductive web, each pillar including a transistor and a second capacitor region, the combination forming a crosspoint array of memory cells; and the pair of overlapping conductive layers forms wordlines for a column of cells, each of said layers including a segment protruding into the trench upper portion along the channel region to form a control gate for a different transistor in the column.

7. The cell according to claim 6 wherein each of the overlapping layers includes a plurality of segments protruding into the trench upper portion to form control gates for the column of cells, protruding segments from different layers alternately arranged to simultaneously control conduction in alternate cell transistors.

8. The cell according to claim 1 wherein the semiconductor body comprises a single crystal silicon and the first conductive region comprises polycrystalline silicon.

9. The cell according to claim 1 wherein a portion of the second capacitor region includes a second source/drain region for the transistor.

10. The cell according to claim 9 wherein the semiconductor body is predominately P-type silicon and the source/drain regions are N+ silicon.

11. A memory device of the type formed with an array of cells, each cell including a transistor coupled to a storage capacitor, said device comprising:

a semiconductor body having an upper surface and a plurality of trench regions formed therein, each trench region including a trench upper portion extending toward the semiconductor upper surface and a trench lower portion extending away from the upper surface and into the semiconductor body;

an array of one transistor memory cells each including a first source/drain region formed on the upper semiconductor surface and a channel region formed along a trench upper portion, a first capacitor region formed in the trench lower portion, a second capacitor region formed in the semiconductor body adjacent the first capacitor region and extending toward the transistor channel region and an insulative layer positioned to provide electrical isolation between said first and second capacitor regions; and a pair of overlapping conductive layers electrically isolated from one another and extending along the upper surface of the semiconductor body adjacent a first plurality of the memory cells.

12. The device of claim 11 wherein each of said layers is a word line comprising segments protruding into trench upper portions to form control gates for transistor channel regions of the first plurality of memory cells.

13. The device of claim 12 wherein:

the first plurality of memory cells forms a row in the array of cells; and control gates associated with each word line are alternately arranged such that each word line controls alternate cells along the row.

14. The device of claim 11 wherein trench regions are interconnected to define a plurality of pillars on and about which the memory cells are formed.

15. The device of claim 11 wherein:

the first plurality of memory cells forms a row in the array of cells;

each of said layers is a word line comprising segments protruding into trench upper portions to form control gates for transistor channel regions of the first plurality of memory cells;

control gates associated with each word line are alternately arranged such that each word line controls alternate cells along the row;

trench regions are interconnected to define a plurality of pillars on and about which memory cells are formed; and the first capacitor regions of each cell in the row are interconnected.

16. The device of claim 15 wherein the semiconductor body predominately comprises lightly doped monocrystalline silicon and the first capacitor regions are formed of polycrystalline silicon.

17. The device of claim 15 wherein the array of cells is arranged in rows and columns said device comprising a bit line along each column and a plurality of additional pairs of overlapping wordlines each pair extending along a row of the array, wordlines of each pair connected to gates of alternate cells in a row thereby providing a crosspoint array with a memory cell positioned at the crossing of each bit line and word line pair.

18. A memory device of the type formed with an array of memory cells wherein each cell includes a transistor; said device comprising:

a plurality of bit lines and a plurality of pairs of overlapping word lines crossing the bit lines;

memory cells positioned at crossings of bit lines and word line pairs to form rows and columns of cells, each memory cell comprising a transistor having a channel region and a gate for controlling conduction through the channel region, word lines of a pair connected to gates of alternate ones of said transistors along a row of cells.

19. The device of claim 18 wherein, for the plurality of wordline paris, wordlines of each pair are alternately connected to transistor gates in a row to provide a cross point array with a memory cell at each crossing of a bit line and a word line pair.

20. The device of claim 19 wherein adjacent pairs of bit lines are connected to sense amplifiers in a folded bit line configuration.

21. The device according to claim 34 wherein each of said cells comprises a storage capacitor coupled to a transistor source region, each cell transistor including a source-to-drain path coupled to a bit line.

22. The device of claim 18 wherein:

each of said cells is formed along a semiconductor body having an upper surface and a plurality of trench regions formed therein, each trench region including a trench upper portion extending toward the semiconductor upper surface and a trench lower portion extending away from the upper surface and into the semiconductor body;

each memory cell includes a first source/drain region formed on the upper semiconductor surface, a first capacitor region formed in the trench lower portion and a second capacitor region formed in the semiconductor body adjacent the first capacitor region; and for each cell a transistor channel region is formed along a trench upper portion with the first capacitor region extending toward the transistor channel region, each cell further including an insulative layer positioned to provide electrical isolation between said first and second capacitor regions.

23. The device of claim 22 wherein trench regions are interconnected to define a plurality of pillars each extending from a trench lower portion to the upper surface of the semiconductor body and wherein memory cells are formed on and about pillars.

24. The device of claim 22 wherein the first capacitor region of each cell surrounds a pillar.

25. The device of claim 22 wherein trench regions are interconnected and the first capacitor regions are interconnected along the trench regions to form a conductive web.

26. The device of claim 22 wherein adjacent pairs of bit lines are connected to sense amplifiers in a folded bit line configuration.

27. The device of claim 22 wherein for each memory cell the second capacitor region undergoes inversion when a voltage is applied to the first capacitor region.

28. The device according to claim 18 wherein the memory cells are formed in a semiconductor body predominately comprising lightly doped monocrystalline silicon, the first capacitor regions comprise polysilicon and the cell transistors are N-channel type.

* * * * *